(12) United States Patent
Kim

(10) Patent No.: US 9,350,329 B2
(45) Date of Patent: May 24, 2016

(54) SEMICONDUCTOR DEVICE TO BLOCK A NOISE FLOWING GROUND TERMINAL

(71) Applicant: SK hynix Inc., Icheon-si Gyeonggi-do (KR)

(72) Inventor: Jong Su Kim, Icheon-si (KR)

(73) Assignee: SK Hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/527,312

(22) Filed: Oct. 29, 2014

(65) Prior Publication Data

US 2016/0006419 A1    Jan. 7, 2016

(30) Foreign Application Priority Data

Jul. 7, 2014    (KR) .................. 10-2014-0084266

(51) Int. Cl.
*H03K 3/01*  (2006.01)
*H03K 3/013*  (2006.01)
*H03K 19/003*  (2006.01)

(52) U.S. Cl.
CPC .......... *H03K 3/013* (2013.01); *H03K 19/00346* (2013.01)

(58) Field of Classification Search
CPC . H03K 3/012; H03K 19/0019; H03K 19/003; H03K 3/037; H03K 17/063
USPC .......................... 327/109, 333, 540, 541, 551
See application file for complete search history.

(56) References Cited

U.S. PATENT DOCUMENTS 8,120,416 B2 *   2/2012   Kim .................. H03K 19/00369
                                                  327/551

FOREIGN PATENT DOCUMENTS

KR    1020080069299 A    7/2008
KR    1020130133678 A    12/2013

* cited by examiner

*Primary Examiner* — John Poos
(74) *Attorney, Agent, or Firm* — William Park & Associates Ltd.

(57) ABSTRACT

An electronic system may include a first circuit driven by a first power voltage signal and a first ground voltage signal, and a second circuit driven by a second power voltage signal and a second ground voltage signal. The electronic system may also include a stabilizer coupled between a first ground terminal and a second ground terminal and suitable for blocking a current flowing from the second ground terminal toward the first ground terminal.

7 Claims, 4 Drawing Sheets

SEMICONDUCTOR DEVICE TO BLOCK A NOISE FLOWING GROUND TERMINAL

CROSS-REFERENCE TO RELATED APPLICATION

The present application claims priority under 35 U.S.C. 119(a) to Korean Application No. 10-2014-0084266, filed on Jul. 7, 2014, in the Korean Intellectual Property Office, which is incorporated herein by reference in its entirety as set forth in full.

BACKGROUND

1. Technical Field

Embodiments of the present disclosure generally relate to electronic systems.

2. Related Art

As fabrication processes of semiconductor devices such as memory chips rapidly develop, storage capacities of the memory chips have increased and operation speeds of the memory chips have increased as well. However, in such a case, widths of signal lines and spaces between the signal lines may be reduced. Reducing the widths of the signal lines and spaces between the signal lines may cause noise between the electrical signals or interferences between the electrical signals. As a result, the memory chips may malfunction due to the noise or the interference between the electrical signals.

In the event that spaces between adjacent circuits or adjacent power lines (or signal lines) of the semiconductor devices are reduced, parasitic capacitance values between the adjacent circuits or the adjacent power lines (or the adjacent signal lines) may increase. This may cause distortion or delay of data signals transmitted from transmitters to receivers through the power lines (or the signal lines). Thus, the semiconductor devices may malfunction. Accordingly, many efforts have been concentrated on a process design or a circuit design of the semiconductor devices to prevent the semiconductor devices from malfunctioning due to the noise or interference between the electrical signals.

SUMMARY

According to an embodiment, an electronic system may include a first circuit driven by a first power voltage signal and a first ground voltage signal. The electronic system may include a second circuit driven by a second power voltage signal and a second ground voltage signal. The electronic system may also include a stabilizer coupled between a first ground terminal and a second ground terminal and suitable for blocking a current flowing from the second ground terminal toward the first ground terminal.

According to an embodiment, an electronic system may include a first circuit driven by a first power voltage signal and a first ground voltage signal. The electronic system may include a second circuit driven by a second power voltage signal and a second ground voltage signal. The electronic system may also include a stabilizer coupled between a first ground terminal and a second ground terminal and suitable for preventing noise from being introduced into the first ground terminal or the second ground terminal.

DETAILED DESCRIPTION OF THE EMBODIMENTS

Embodiments of the present disclosure will be described hereinafter with reference to the accompanying drawings. However, the embodiments described herein are for illustrative purposes only and are not intended to limit the scope of the present disclosure.

Figure 1:
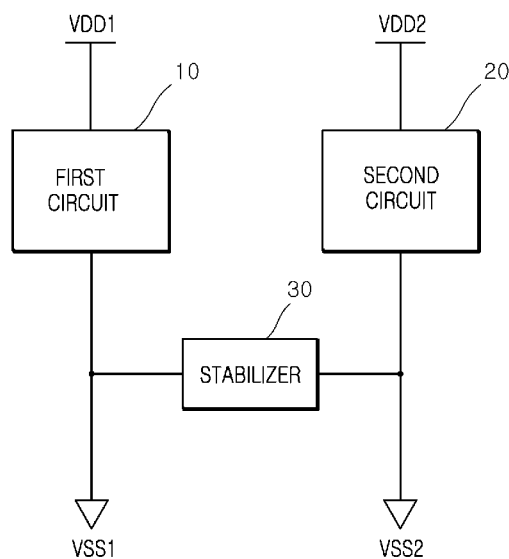
FIG. 1 is a block diagram illustrating a representation of an electronic system according to an embodiment.

Referring to FIG. 1, an electronic system according to an embodiment may include a first circuit 10, a second circuit 20 and a stabilizer 30.

The first circuit 10 may receive a first power voltage signal VDD1 to operate. The first circuit 10 may receive a first ground voltage signal VSS1 to operate.

The second circuit 20 may receive a second power voltage signal VDD2 to operate. The second circuit 20 may receive a second ground voltage signal VSS2 to operate. The first circuit 10 may correspond to an electronic circuit that realizes a memory chip, a controller chip or a processor chip. The second circuit 20 may correspond to an electronic circuit that realizes a memory chip, a controller chip or a processor chip. In addition, the first circuit 10 may be encapsulated to have a system on chip (SiC) package form, a system in package (SiP) form, or a package on package (PoP) form. The second circuit 20 may also be encapsulated to have a system on chip (SiC) package form, a system in package (SiP) form, or a package on package (PoP) form. The second power voltage signal VDD2 may have a voltage level that is higher than a voltage level of the first power voltage signal VDD1.

The stabilizer 30 may be coupled between a first ground voltage signal VSS1 terminal and a second ground voltage signal VSS2 terminal. The stabilizer 30 may block a current that flows from the second ground voltage signal VSS2 terminal toward the first ground voltage signal VSS1 terminal. The stabilizer 30 may block noise that is introduced into the first ground voltage signal VSS1 terminal from the second ground voltage signal VSS2 terminal.

Figure 2:
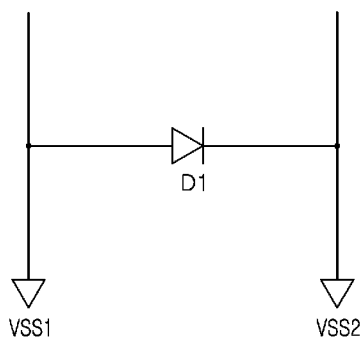
FIG. 2 is a circuit diagram illustrating a representation of a stabilizer included in the electronic system of FIG. 1.

Referring to FIG. 2, the stabilizer 30 may include a diode D1. The anode of the diode D1 may be connected to the first ground voltage signal VSS1 terminal. The cathode of the diode D1 may be connected to the second ground voltage signal VSS2 terminal. The stabilizer 30 may block a current flowing from the second ground voltage signal VSS2 terminal toward the first ground voltage signal VSS1 terminal. The stabilizer may prevent noise from being introduced into the first ground voltage signal VSS1 terminal from the second ground voltage signal VSS2 terminal. The diode D1 may allow a current to flow from the anode thereof toward the cathode thereof. Electric charges emitted from the anode of the diode D1 may be drifted toward the cathode of the diode D1.

An operation of the electronic system having the aforementioned configurations will be described hereinafter with reference to FIGS. 1 and 2 in conjunction with examples in which a voltage level of the second ground voltage signal VSS2 used to operate the second circuit 20 fluctuates to generate noise.

The first circuit 10 may receive the first power voltage signal VDD1 and the first ground voltage signal VSS1 to operate.

The second circuit 20 may receive the second power voltage signal VDD2 and the second ground voltage signal VSS2 to operate.

The stabilizer 30 may be coupled between the first ground voltage signal VSS1 terminal and the second ground voltage signal VSS2 terminal to block a current that flows from the second ground voltage signal VSS2 terminal toward the first ground voltage signal VSS1 terminal. The anode of the diode D1 may act as the stabilizer 30 and may be connected to the first ground voltage signal VSS1 terminal. The cathode of the diode D1 may act as the stabilizer 30 and may be connected to the second ground voltage signal VSS2 terminal such that the diode D1 may block a current flowing from the second ground voltage signal VSS2 terminal toward the first ground voltage signal VSS1 terminal to prevent noise from being introduced into the first ground voltage signal VSS1 terminal from the second ground voltage signal VSS2 terminal.

Figure 3:
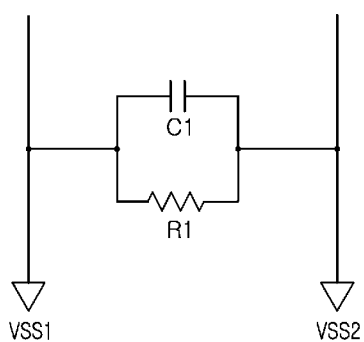
FIGS. 3, 4 and 5 are circuit diagrams illustrating representations of other embodiments of stabilizers with which the stabilizer illustrated in FIG. 2 may be replaced.
Figure 4:
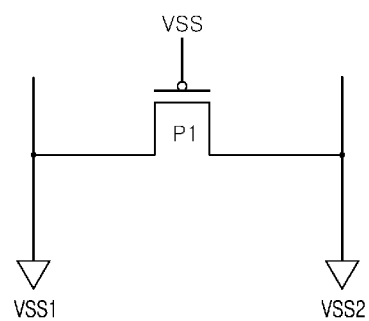
Figure 5:
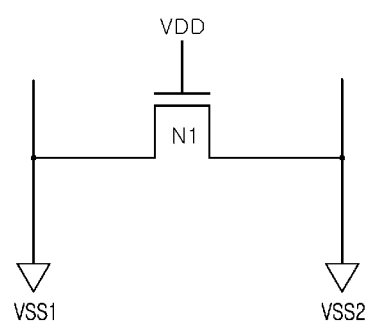

FIGS. 3, 4 and 5 illustrate various examples of stabilizers 30a, 30b and 30c, one of which, for example but not limited to, may be used instead of the stabilizer 30 illustrated in FIG. 2.

Referring to FIG. 3, the stabilizer 30a may include a capacitor C1 and a resistor R1. The capacitor C1 and resistor R1 may be connected in parallel. The capacitor C1 may be coupled between the first ground voltage signal VSS1 terminal and the second ground voltage signal VSS2 terminal. The resistor R1 may be coupled between the first ground voltage signal VSS1 terminal and the second ground voltage signal VSS2 terminal. Accordingly, the stabilizer 30a may operate as, for example but not limited to, an RC filter including the capacitor C1 and the resistor R1 that are coupled in parallel between the first ground voltage signal VSS1 terminal and the second ground voltage signal VSS2 terminal. The positioning of the capacitor C1 and the resistor R1, may prevent noise from being introduced into the first ground voltage signal VSS1 terminal or the second ground voltage signal VSS2 terminal even though the voltage level of the second ground voltage signal VSS2 fluctuates to generate noise.

An operation of the electronic system including the stabilizer 30a having the aforementioned configuration will be described hereinafter with reference to FIGS. 1 and 3 in conjunction with examples in which a voltage level of the second ground voltage signal VSS2 used to operate the second circuit 20 fluctuates to generate noise.

The first circuit 10 may receive the first power voltage signal VDD1 and the first ground voltage signal VSS1 to operate.

The second circuit 20 may receive the second power voltage signal VDD2 and the second ground voltage signal VSS2 to operate.

The stabilizer 30a may operate as, for example but not limited to, an RC filter including the capacitor C1 and the resistor R1. The capacitor C1 and the resistor R1 may be coupled in parallel between the first ground voltage signal VSS1 terminal and the second ground voltage signal VSS2 terminal. The positioning of the capacitor C1 and the resistor R1 may prevent noise from being introduced into the first ground voltage signal VSS1 terminal or the second ground voltage signal VSS2 terminal even though the voltage level of the second ground voltage signal VSS2 fluctuates to generate noise.

Referring to FIG. 4, the stabilizer 30b may be configured to include a first drive element P1. The first drive element P1 may include, for example but not limited to, a PMOS transistor. The first drive element P1 may be coupled between the first ground voltage signal VSS1 terminal and the second ground voltage signal VSS2 terminal. The first drive element P1 may be turned on in response to a ground voltage signal VSS. The stabilizer 30b may clamp the first and second ground voltage signals VSS1 and VSS2 through the first drive element P1 turned on in response to the ground voltage signal VSS. The stabilizer 30b may prevent noise from being introduced into the first ground voltage signal VSS1 terminal or the second ground voltage signal VSS2 terminal even though the voltage level of the second ground voltage signal VSS2 fluctuates to generate noise. In such examples, the first drive element P1 may be designed to have a relatively high resistance value such that a current flowing between the first ground voltage signal VSS1 terminal and the second ground voltage signal VSS2 terminal is blocked. The ground voltage signal VSS may have the same voltage level as the first ground voltage signal VSS1 or the second ground voltage signal VSS2 to turn on the first drive element P1.

An operation of the electronic system including the stabilizer 30b having the aforementioned configurations will be described hereinafter with reference to FIGS. 1 and 4 in conjunction with examples in which a voltage level of the second ground voltage signal VSS2 used to operate the second circuit 20 fluctuates to generate noise.

The first circuit 10 may receive the first power voltage signal VDD1 and the first ground voltage signal VSS1 to operate.

The second circuit 20 may receive the second power voltage signal VDD2 and the second ground voltage signal VSS2 to operate.

The stabilizer 30b may clamp the first and second ground voltage signals VSS1 and VSS2 through the first drive element P1. The first drive element P1 may include for example but not limited to a PMOS transistor. The first drive element P1 may be coupled between the first ground voltage signal VSS1 terminal and the second ground voltage signal VSS2 terminal. The first drive element P1 may be turned on in response to the ground voltage signal VSS, and may prevent noise from being introduced into the first ground voltage signal VSS1 terminal or the second ground voltage signal VSS2 terminal even though the voltage level of the second ground voltage signal VSS2 fluctuates to generate noise.

Referring to FIG. 5, the stabilizer 30c may be configured to include a second drive element N1. The second drive element may include, for example but not limited to, an NMOS transistor. The second drive element N1 may be coupled between the first ground voltage signal VSS1 terminal and the second ground voltage signal VSS2 terminal. The second drive element may be turned on in response to a power voltage signal VDD. The stabilizer 30c may clamp the first and second ground voltage signals VSS1 and VSS2 through the second drive element N1 turned on in response to the power voltage signal VDD, and may prevent noise from being introduced into the first ground voltage signal VSS1 terminal or the second ground voltage signal VSS2 terminal even though the voltage level of the second ground voltage signal VSS2 fluctuates to generate noise. In such examples, the second drive element N1 may be designed to have a relatively high resistance value such that a current flowing between the first ground voltage signal VSS1 terminal and the second ground voltage signal VSS2 terminal is blocked. The power voltage signal VDD may have the same voltage level as the first power voltage signal VDD1 or the second power voltage signal VDD2 to turn on the second drive element N1.

An operation of the electronic system including the stabilizer 30c having the aforementioned configurations will be described hereinafter with reference to FIGS. 1 and 5 in conjunction with examples in which a voltage level of the second ground voltage signal VSS2 used to operate the second circuit 20 fluctuates to generate noise.

The first circuit 10 may receive the first power voltage signal VDD1 and the first ground voltage signal VSS1 to operate.

The second circuit 20 may receive the second power voltage signal VDD2 and the second ground voltage signal VSS2 to operate.

The stabilizer 30c may clamp the first and second ground voltage signals VSS1 and VSS2 through the second drive element N1. The second drive element N1 may include, for example but not limited to, an NMOS transistor. The second drive element N1 may be coupled between the first ground voltage signal VSS1 terminal and the second ground voltage signal VSS2 terminal. The second drive element N1 may be turned on in response to the power voltage signal VDD, and may prevent noise from being introduced into the first ground voltage signal VSS1 terminal or the second ground voltage signal VSS2 terminal even though the voltage level of the second ground voltage signal VSS2 fluctuates to generate noise.

As described above, the semiconductor systems according to the embodiments may block a current flowing between two ground terminals of two different circuits driven by two different power voltage signals VDD1 and VDD2, and may prevent noise generated in one of the multiple circuits from being introduced into the other circuit of the plurality of circuits.

Figure 6:
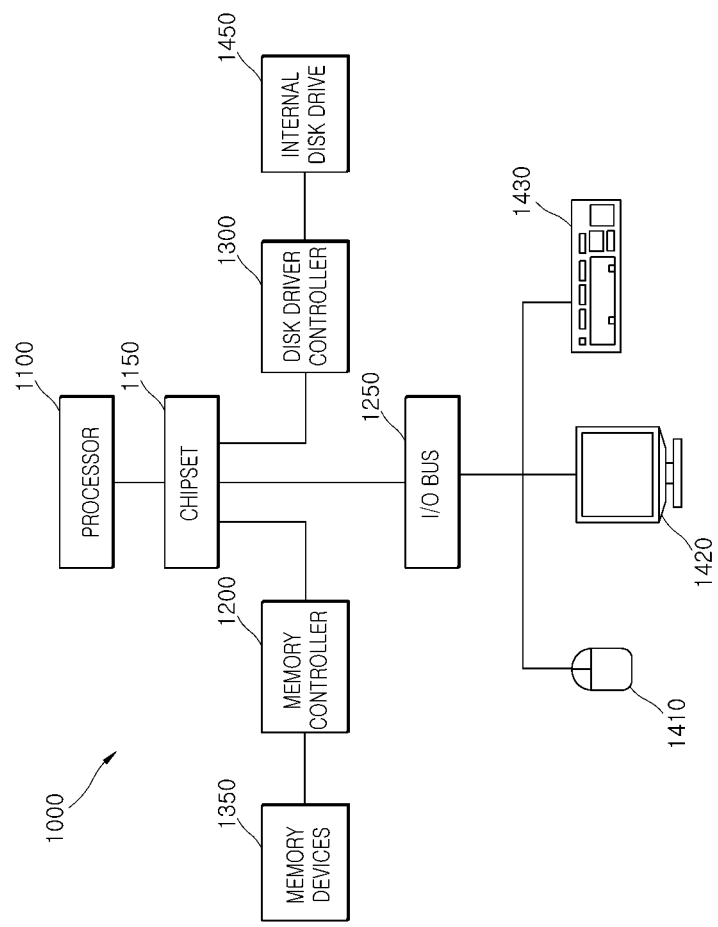
FIG. 6 illustrates a block diagram of an example of a representation of a system employing the electronic system in accordance with the embodiments discussed above with relation to FIGS. 1-5.

The electronic systems discussed above (see FIGS. 1-5) are particular useful in the design of memory devices, processors, and computer systems. For example, referring to FIG. 6, a block diagram of a system employing the electronic systems in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one electronic system as discussed above with reference to FIGS. 1-5. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one electronic system as discussed above with relation to FIGS. 1-5, the memory devices 1350 may include a plurality of word lines and a plurality of bit lines for defining a plurality of memory cell. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 6 is merely one example of a system employing the electronic system as discussed above with relation to FIGS. 1-5. In alternate embodiments, such as cellular phones or digital cameras, the components may differ from the embodiments illustrated in FIG. 6.

While various embodiments have been described above, it will be understood to those skilled in the art that the embodiments described are by way of example only. Accordingly, the refresh circuit described herein should not be limited based on the described embodiments.

What is claimed is:
1. An electronic system comprising:
a first circuit suitable for being driven by a first power voltage signal and a first ground voltage signal;
a second circuit suitable for being driven by a second power voltage signal and a second ground voltage signal; and
a stabilizer coupled between a first ground terminal and a second ground terminal and suitable for preventing interference from being introduced into the first ground terminal or the second ground terminal,
wherein the stabilizer includes:
a capacitor coupled between the first ground terminal and the second ground terminal; and
a resistor coupled between the first ground terminal and the second ground terminal,
wherein the capacitor and the resistor are connected in parallel.
2. The electronic system of claim 1,
wherein the first ground terminal is suitable for outputting the first ground voltage signal, and
wherein the second ground terminal is suitable for outputting the second ground voltage signal.
3. The electronic system of claim 2, wherein the second power voltage signal has a greater voltage level than a voltage level of the first power voltage signal.
4. The electronic system of claim 2,
wherein the stabilizer includes a first drive element coupled between the first ground terminal and the second ground terminal; and wherein the first drive element is turned on in response to the first ground voltage signal or the second ground voltage signal.

5. The electronic system of claim 2,
wherein the stabilizer includes a PMOS transistor coupled between the first ground terminal and the second ground terminal, and
wherein the stabilizer is suitable for clamping the first and second ground voltage signals in response to receiving a ground voltage signal.

6. The electronic system of claim 2,
wherein the stabilizer includes a second drive element coupled between the first ground terminal and the second ground terminal; and
wherein the second drive element is turned on in response to the first power voltage signal or the second power voltage signal.

7. The electronic system of claim 2,
wherein the stabilizer includes an NMOS transistor coupled between the first ground terminal and the second ground terminal, and
wherein the stabilizer is suitable for clamping the first and second ground voltage signals in response to receiving a power voltage signal.

* * * * *